United States Patent [19]

Sakao

[11] Patent Number: 5,463,236
[45] Date of Patent: Oct. 31, 1995

[54] SEMICONDUCTOR MEMORY DEVICE HAVING IMPROVED ISOLATION STRUCTURE AMONG MEMORY CELLS

[75] Inventor: Masato Sakao, Tokyo, Japan

[73] Assignee: NEC Corporation, Tokyo, Japan

[21] Appl. No.: 242,836

[22] Filed: May 16, 1994

[30] Foreign Application Priority Data

May 16, 1993 [JP] Japan .................... 5-136800

[51] Int. Cl.$^6$ .................................................. H01L 29/78
[52] U.S. Cl. ................... 257/306; 257/513; 257/630
[58] Field of Search .................................. 257/306, 296, 257/303, 504, 513, 316, 630

[56] References Cited

U.S. PATENT DOCUMENTS

| | | | |
|---|---|---|---|
| 5,045,899 | 9/1991 | Arimoto | 257/306 |
| 5,111,257 | 5/1992 | Andoh et al. | 257/630 |
| 5,225,704 | 7/1993 | Wakamiya et al. | 257/409 |
| 5,245,212 | 9/1993 | Gill | 257/504 |

FOREIGN PATENT DOCUMENTS

4-125961  4/1992  Japan .................... 257/306

*Primary Examiner*—Robert P. Limanek
*Attorney, Agent, or Firm*—Sughrue, Mion, Zinn, Macpeak & Seas

[57] ABSTRACT

A semiconductor memory device including a plurality of memory cells of one-transistor and one-capacitor type is disclosed. The memory cells are formed respectively in active regions each isolated from peripheral active regions by trench isolation regions in a first direction and by isolation gate conductors supplied with a bias potential in a second direction perpendicular to the first direction. Each of the trench isolation regions comprises a trench selectively formed in a semiconductor substrate and a first insulating film filling the trench and each of the isolation conductors is formed simultaneously with word lines and is thus isolated from the substrate by a second insulating film which has the same thickness as the gate insulating film of the cell transistor.

8 Claims, 7 Drawing Sheets

SEMICONDUCTOR MEMORY DEVICE HAVING IMPROVED ISOLATION STRUCTURE AMONG MEMORY CELLS

BACKGROUND OF THE INVENTION

The present invention relates to a semiconductor memory device and, more particularly, to a dynamic random access memory device (DRAM) having memory cells each composed of one transistor and one storage capacitor.

In accordance with increase in memory capacity of a DRAM, an area which is able to be allotted to each memory cell, i.e. a cell size, is required be made small. Therefore, such a memory cell is required that can enlarge the capacitance value of the storage capacitor with a small cell size.

Figure 1A:
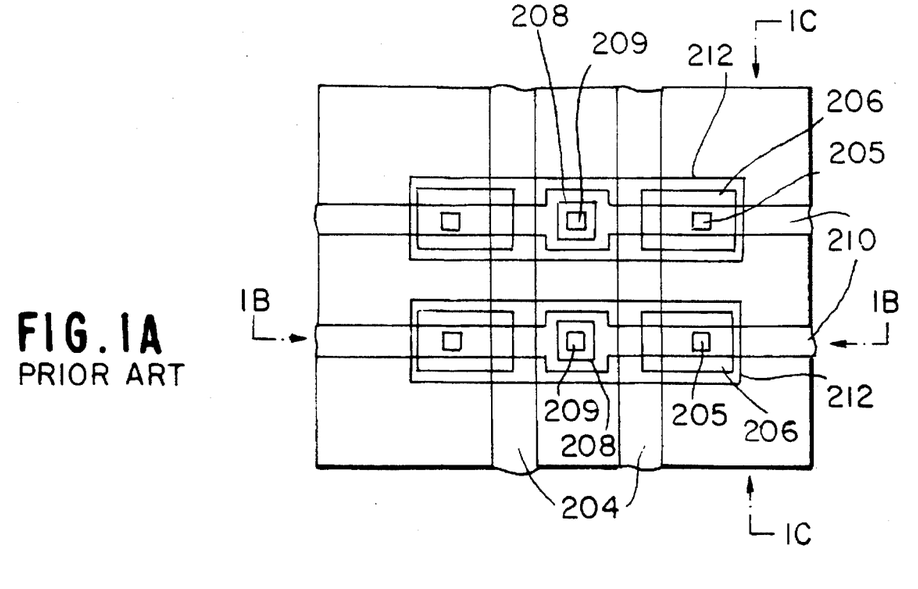
FIGS. 1A, 1B and 1C illustrate a part of a memory cell array portion of a memory device according to the prior art and are respectively a plan view, a cross view along a line A—A' shown in FIG. 1A and a cross sectional view along a line B—B' shown in FIG. 1A.
Figure 1B:
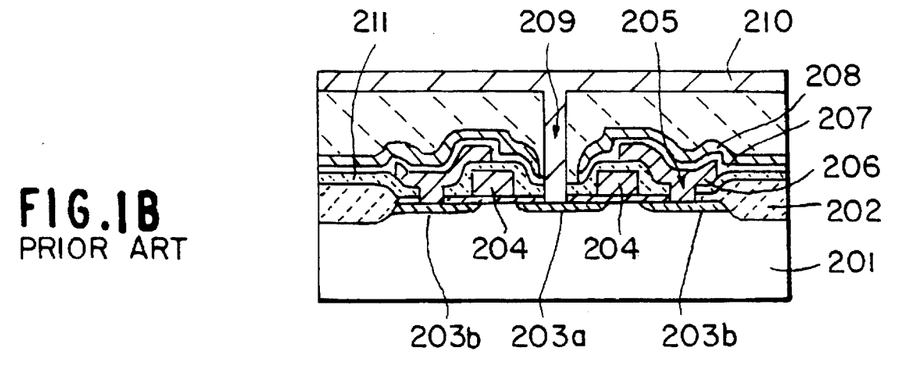
Figure 1C:
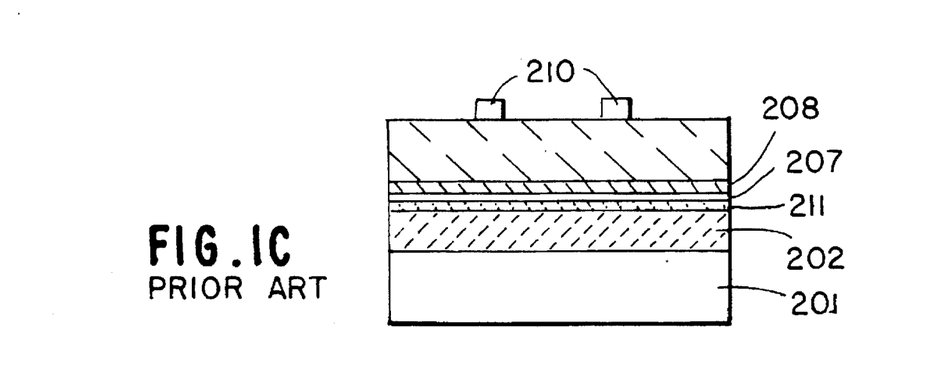

As one of memory cells for that purpose, the so-called stacked-type memory cell is known in the art and shown in FIGS. 1A to 1C. FIG. 1A is a plan view of the stacked memory cell and FIGS. 1B and 1C are cross sectional views along lines A—A and B—B shown in FIG. 1A, respectively. In this memory cell, the reference numeral 201 denotes a silicon substrate and 204 denotes a word line serving as the gate electrode of a cell transistor. The reference numeral 209 denoted a bit line contact for connecting a bit line 210 and one of the drain region 203a of the cell transistor, 205 denoting a capacitor contact for connecting a storage electrode 206 and the source region 203b, 207 denoting a dielectric film, 208 denoting a cell plate electrode 208, and 211 denoting an interlayer insulating film made of silicon oxide. The storage capacitor is thus composed of the electrodes 206 and 208 and the dielectric film 207 formed therebetween and stacked over the word line 204. Accordingly, the memory cell presents a relatively large storage capacitance value with a small cell size.

As shown in the drawings, the isolation between the adjacent memory cells is performed by the so-called selective-oxidation insulating film 202. This insulating film 202 is formed by selectively covering the substrate 201 with a oxidation-withstand film and then oxidizing the substrate 201 by using the oxidation-withstand film as a mask. The parts of the substrate 201 which are not covered with the oxidation-withstand film are thereby converted into an oxide film. Thus, the selective-oxidation insulating film 202 is formed. Each of the regions surrounded by the selective-oxidation insulating film 202 are called an "active region". That is, each of the active regions 212 is defined by the selective-oxidation insulating film 202.

Each active region 212 is generally designed to be formed in a rectangular shape. In accordance with the miniaturization of the memory cell, however, each active region 212 is actually formed in a rectangular shape having a rounded corner, as well known in the art. As also known in the art, the selective-oxidation insulating film 202 has the so-called bird's beak portion cutting into the active region 212. For these reasons, the effective area of each active region 212 is made small, so that the capacitor contact 205 happens to be formed on and thus in contact with the selective-oxidation insulating film 202. The leakage of the charges stored in the storage capacitor thereby occurs to destroy the stored data.

SUMMARY OF THE INVENTION

It is therefore an object of the present invention to provide a semiconductor memory device having an improved isolation structure for isolating memory cells from one another.

It is another object of the present invention to provide a semiconductor memory device including memory cells each formed in a rectangular active region with a small size.

A semiconductor memory device according to the present invention comprises a memory cell array formed on a semiconductor substrate and having a plurality of memory cells formed respective active regions in each of which a cell transistor and a storage capacitor are formed, and each of the active regions is isolated from the peripheral active regions by trench isolation regions in a first direction and by isolation gate conductors supplied with a bias potential in a second direction perpendicular to the first direction. Each of the trench isolation regions is composed of a trench formed in the semiconductor substrate and an insulating material filling the trench, and each of isolation gate conductors is formed simultaneously with word lines and thus formed on an insulating film having the same thickness as the gate insulating film of the cell transistor.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 2A:
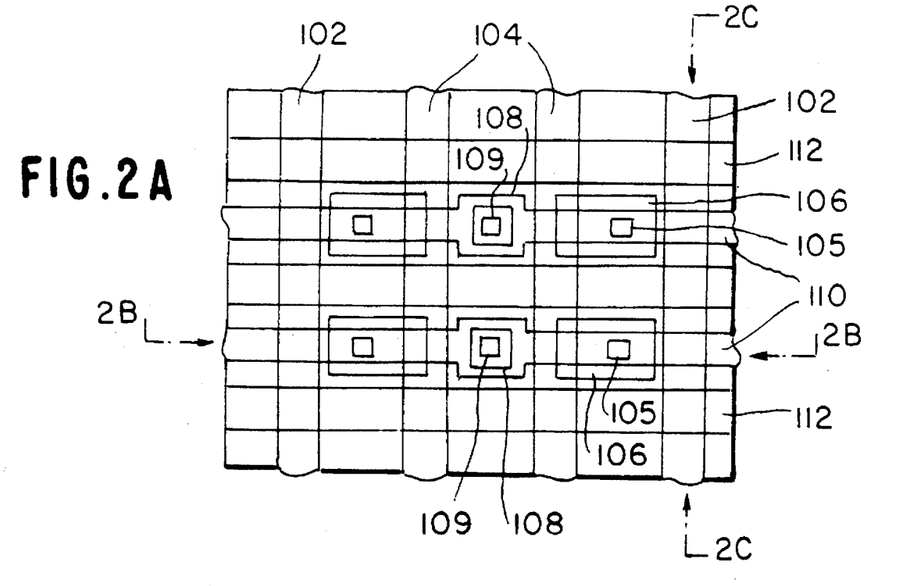
FIGS. 2A, 2B and 2C illustrate a part of a memory cell array portion of a memory device according to an embodiment of the present invention and are respectively a plan view, a cross sectional view along a line A—A' shown in FIG. 2A and a cross sectional view along a line B—B' shown in FIG. 2A.
Figure 2B:
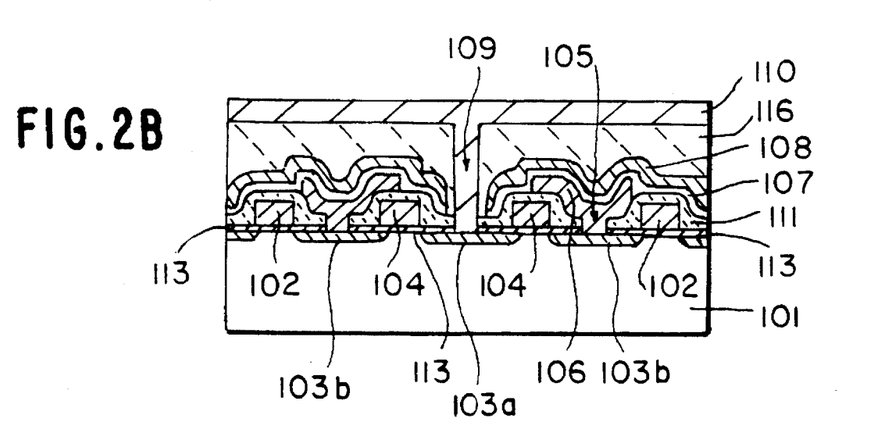
Figure 2C:
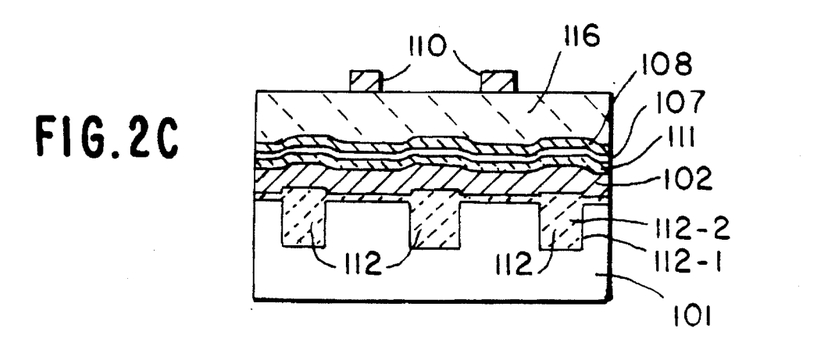

Referring to FIGS. 2A to 2C, there is shown a part of a memory cell array portion of a semiconductor memory device according to an embodiment of the present invention. In these Figures, the reference numeral 101 denotes a semiconductor substrate made of silicon and 104 denotes word lines each also serving as the gate electrode of a cell transistor formed on a gate insulating film 113 covering a channel region between the drain and source regions 103a and 103b. The reference numeral 109 denotes bit line contacts each for connecting each of bit lines 110 to an associated one of the drain regions 103a of the cell transistor, 105 denoting capacitor contacts each for connecting each of storage electrodes 106 to an associated one of the source regions 103b of the cell transistor, 107 and 108 denoting a dielectric film and a cell plate electrode, respectively, and 111 denoting an interlayer insulating film made of silicon oxide. The storage capacitor is thus composed of the storage electrode 106, the dielectric film 107 and the cell plate electrode 108.

The memory cell array portion shown therein further has a plurality of trench isolation regions 112 in accordance with the present invention. Each of the trench isolation regions 112 is formed continuously in the direction perpendicular to the word lines 104 and thus parallel to the bit lines 110 between the adjacent memory cells. Each of the trench isolation regions 112 is composed of a trench 112-1 formed by removing a part of the substrate 101 and an insulating film 112-2 filling the trench 112-1. Thus, the memory cells arranged in the same columns are isolated by the trench isolation regions 112 from those arranged in the adjacent two columns.

The memory cell array portion shown therein also has isolation gate conductors 102 in accordance further with the present invention. Each of the isolation gate conductors 102 is formed continuously in the direction perpendicular to the bit lines 110 and thus parallel to the word lines 104 between the adjacent memory cells. Moreover, each of the isolation gate conductors 102 is formed with the word lines 104 and thus formed on the insulating film having the same thickness as the gate insulating film 113. Although not shown in the drawings, a bias voltage is supplied to each of the isolation gate conductors 102. When the cell transistor is of an N-channel, i.e. when the P-type substrate 101 is employed, the ground voltage is applied to each of the isolation gate conductors 102. In the case of employing the N-type substrate 101 to provide a P-channel cell transistor, on the other hand, a positive power voltage is applied to each of the isolation gate conductors 102. Therefore, although each of the conductors 102 constitutes in device structure a MOS transistor by cooperating the adjacent two regions 103b, this MOS transistor is maintained in a non-conductive state to isolate the adjacent memory cells. Thus, the memory cells arranged in the same row are isolated by the isolation gate conductors 102 from those arranged in the adjacent two rows.

As described above, the isolation among the memory cells in the memory device according to the present invention is performed by the trench isolation region in a column or bit line direction and by the isolation gate conductor in a row or word line direction, not by the selective-isolation insulating film which is employed in the prior art device. Accordingly, each active region in which a memory cell is formed is defined in a fine pattern without transforming the designed shape thereof.

Figure 3A:
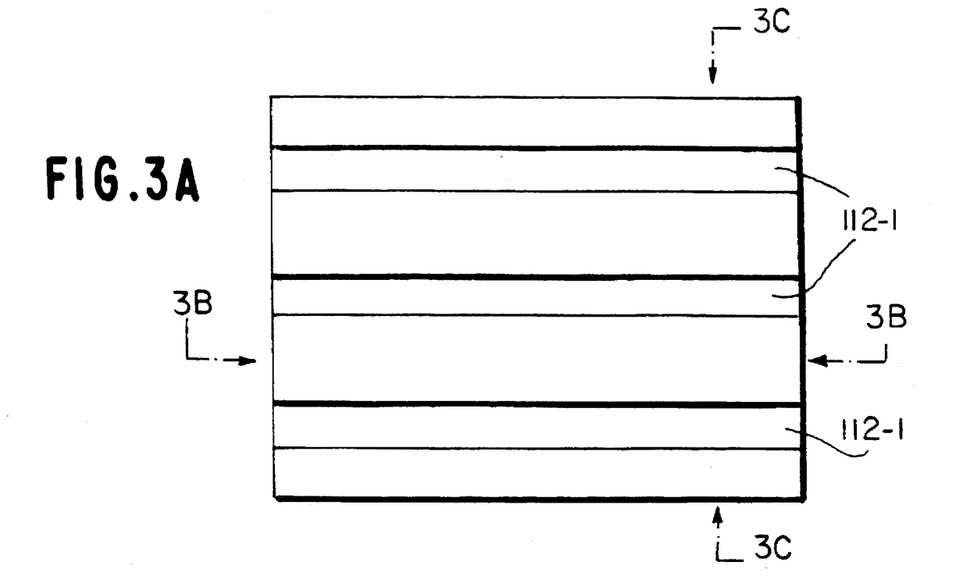
FIGS. 3A, 3B and 3C illustrate one step of manufacturing steps for the device shown in FIG. 2 and are respectively a plan view, a cross sectional view along a line A—A' shown in FIG. 3A and a cross sectional view along a line B—B' shown in FIG. 3A.
Figure 3B:
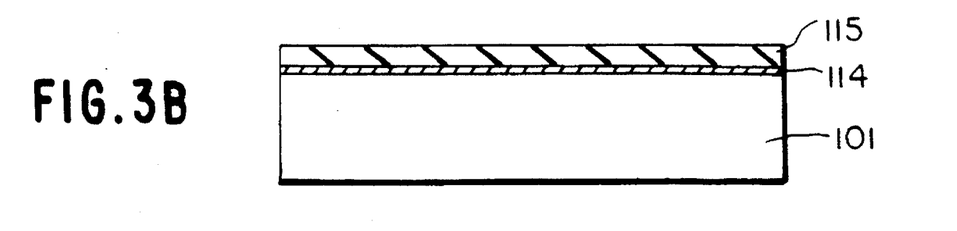
Figure 3C:
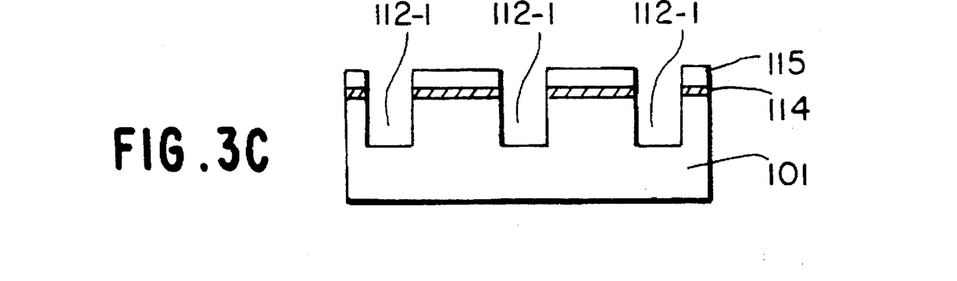

Turning now to FIGS. 3A to 6C, the description will be mode on the manufacturing steps of the memory device as described above. As shown in FIG. 3A to 3C, the silicon substrate 101 is prepared and covered with a silicon oxide film 114 by the thermal oxidation method. A silicon nitride film 115 is thereafter deposited over the entire surface by the chemical vapor deposition (CVD) method. The silicon oxide and nitride film 114 and 115 are then patterned, and the silicon substrate 101 is electively removed by using the remained films 114 and 115 as a mask. The trenches 112-1 running in the column direction are thereby formed.

Figure 4A:
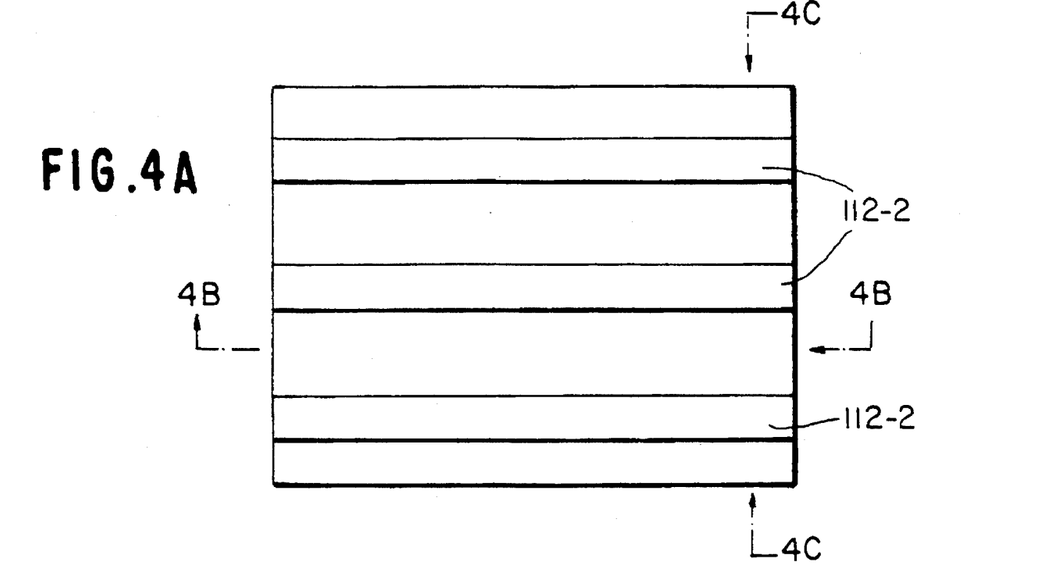
FIGS. 4A, 4B and 4C illustrate a next step of the manufacturing steps and are respectively a plan view, a cross sectional view along a line A—A' shown in FIG. 4A and a cross sectional view along a line B—B' shown in FIG. 4A.
Figure 4B:
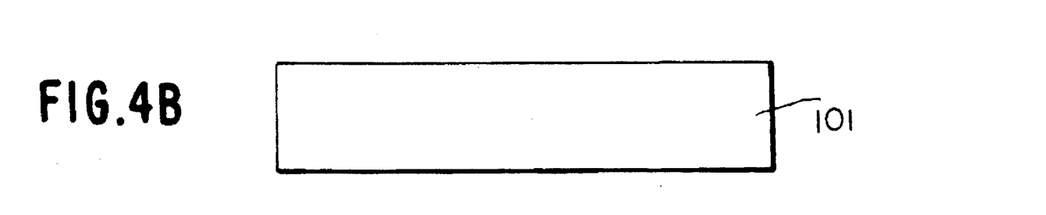
Figure 4C:
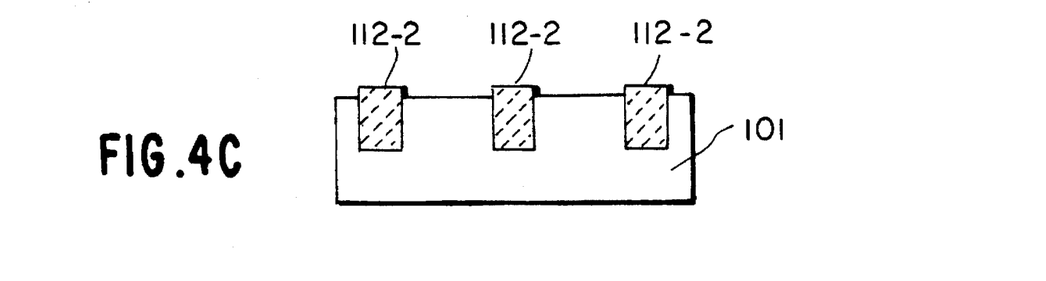

As shown in FIG. 4A to 4C, a silicon oxide film is deposited over the entire surface with filling each of the trenches 112-1 by the CVD method, followed by etching-back until the surface of the silicon nitride film 115 is exposed. The silicon nitride film 115 and the silicon oxide film 114 are thereafter removed. Thus, the trench isolation regions 112 are formed, each composed of the trenches 112-1 and the silicon oxide film 112-2 filling it. If desired, each trench 112-1 is first covered with a thin oxide film and then filled with the film 112-2.

Figure 5A:
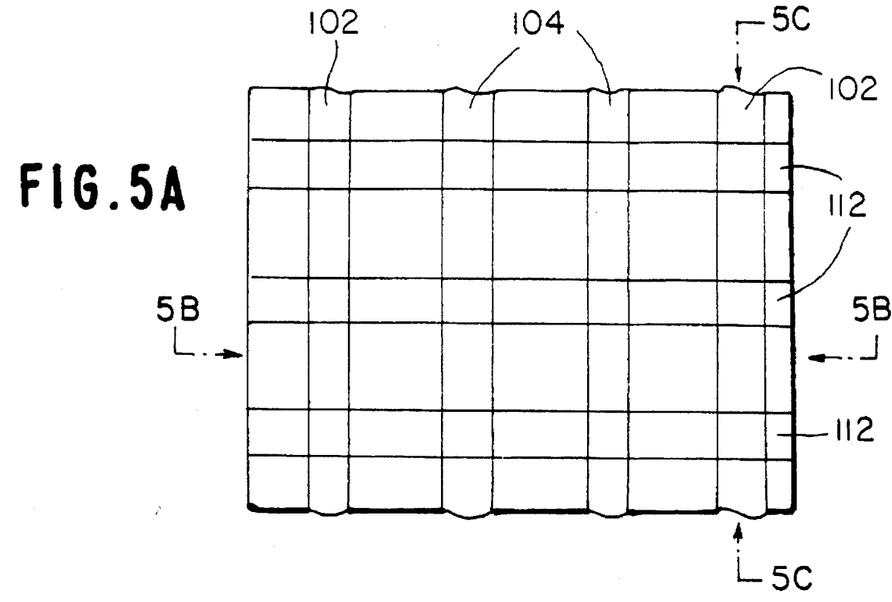
FIGS. 5A, 5B and 5C illustrate a next step of the manufacturing steps and are respectively a plan view, a cross sectional view along a line A—A' shown in FIG. 5A and a cross sectional view along a line B—B' shown in FIG. 5A.
Figure 5B:
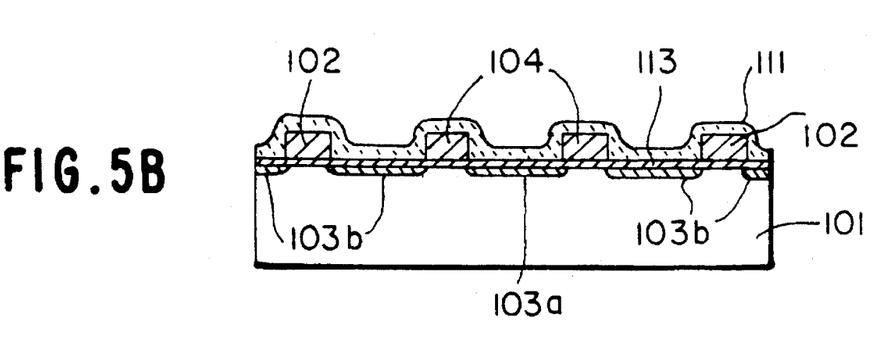
Figure 5C:
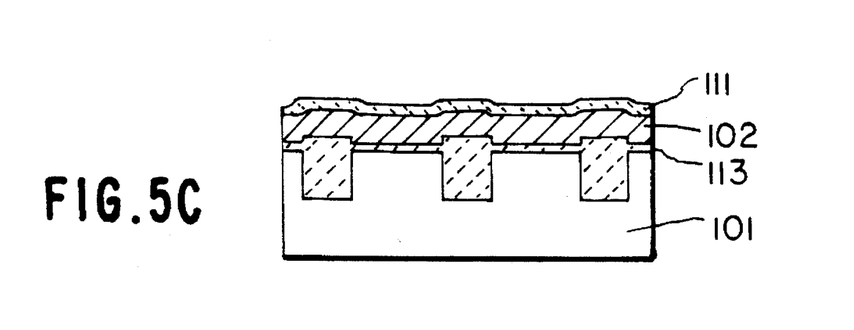

As shown in FIGS. 5A to 5C, the gate oxide film 113 is formed on the substrate 101 by oxidizing the substrate 101. A polysilicon layer doped with impurities is deposited over the entire surface, followed by selective-etching the polysilicon layer to form the word lines 104 as well as the isolation gate conductors 102. By using the isolation regions 102, the word lines 104 and the isolation gate conductors 102 as a mask, impurity-ions are implanted into the substrate 101, following by the annealing to form the source and drain regions 103a and 103b. The interlayer insulating film 111 made of silicon oxide is then deposited over the entire surface.

Figure 6A:
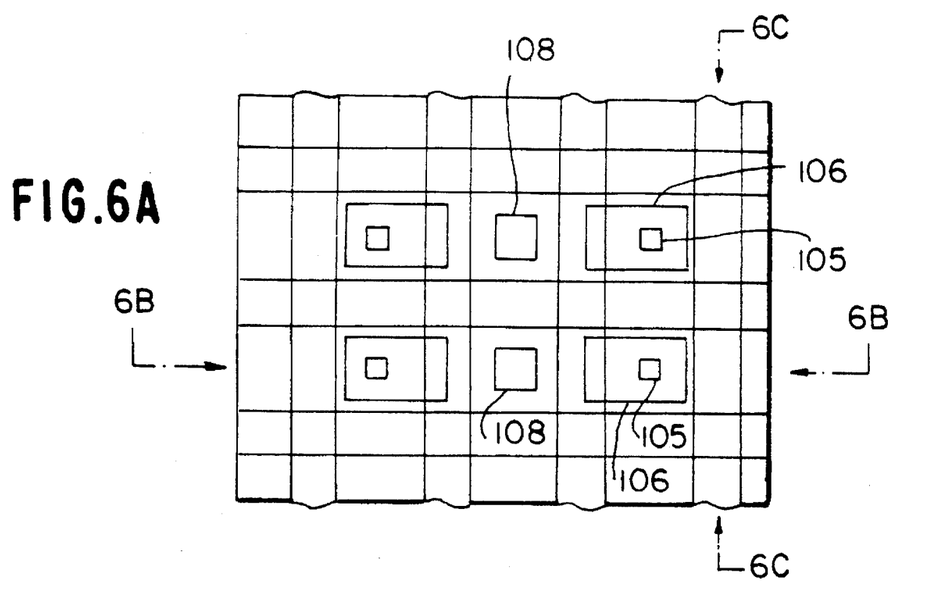
FIGS. 6A, 6B and 6C illustrate a next step of the manufacturing steps and are respectively a plan view, a cross sectional view along a line A—A' shown in FIG. 6A and a cross sectional view along a line B—B' shown in FIG. 6A.
Figure 6B:
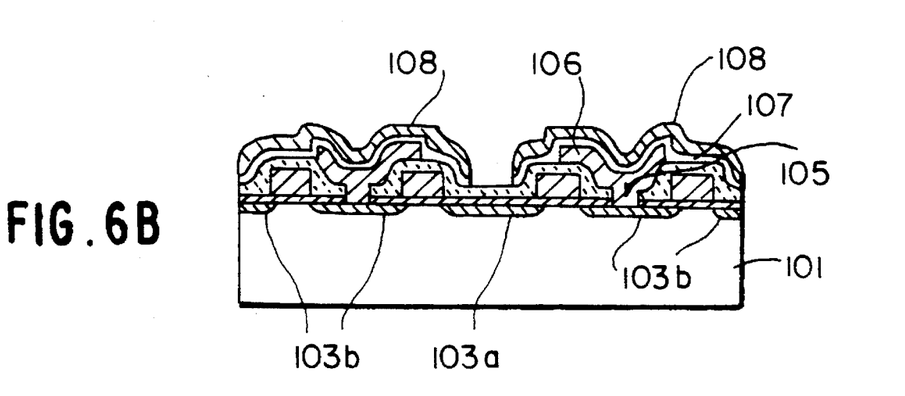
Figure 6C:
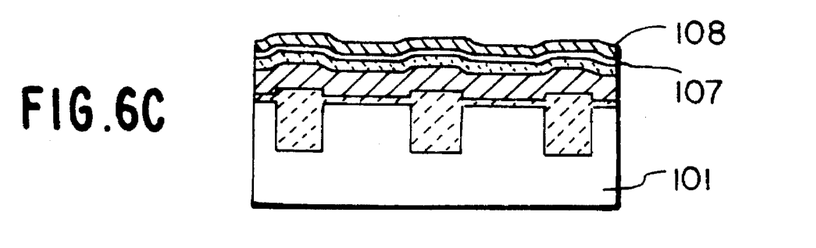
Figure 7A:
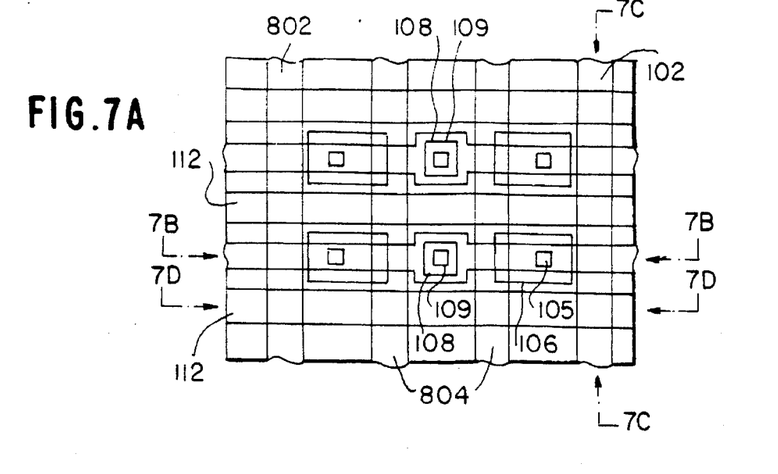
FIGS. 7A, 7B, 7C and 7D illustrate a part of a memory cell array portion of a memory device according to another embodiment of the present invention and are respectively a plan view, a cross sectional view along a line A—A' shown in FIG. 7A, a cross sectional view along a line B—B' shown in FIG. 7A and a cross sectional view along a line C—C' shown in FIG. 7A.
Figure 7B:
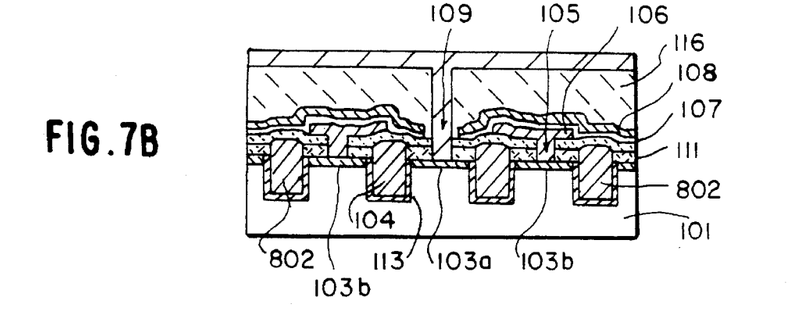
Figure 7C:
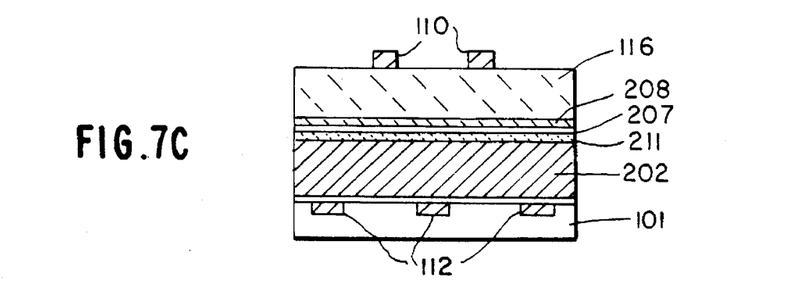
Figure 7D:
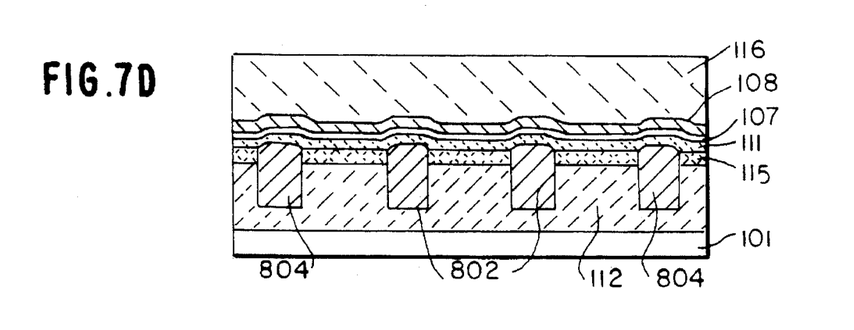

As shown in FIGS. 6A to 6C, the interlayer insulating film 111 and the gate oxide film 113 are selectively removed to form the capacitor contact hole 105. Thereafter, a polysilicon layer doped with impurities indicative of the same conductivity type as the regions 103a and 103b is deposited over the entire surface by the CVD method, followed by selective-etching that polysilicon layer to form the storage electrodes 106 of the storage capacitor. The dielectric film 107 is then deposited over the entire surface. As the dielectric film 107, a silicon oxide film, a silicon nitride film, a combination thereof, or tantalum oxide film can be employed. The cell plate electrode 108 made of polysilicon, tungsten and so forth is thereafter formed on the dielectric film 107. Portions of the dielectric film 106 and the call plate 108 corresponding to the bit line contact are then removed.

Finally, turning back to FIGS. 2A to 2C, the interlayer insulating film such as a silicon oxide film is deposited over the entire surface, and the bit line contact holes 109 are provided to form the respective parts of the drain regions 103a. The bit lines 110 are thereafter formed. Thus, the memory cell array portion shown in FIG. 1 are produced.

Referring to FIG. 7A to 7D, there is shown a part of a memory cell array portion of a memory device according to another embodiment of the present invention in which the same constituents as those shown in FIG. 2 are denoted by the same reference numerals to omit the further description thereof. In this embodiment, as indicated by the reference numerals 802 and 804, each of the isolation gate conductors 802 and the word lines 804 is buried in the substrate 101 in isolation therefrom by the gate insulating film 113. More specifically, after forming the trench isolation regions 112, trenches 800 are formed for the word lines and the isolation gate conductors in the direction of rows by selectively removing the substrate 101 and the trench isolation regions 112. The gate oxide film 113 is thereafter formed on the surface of each of the trenches 800, followed by the word lines 802 and the isolation gate conductor 804. The channel region of the cell transistor is thereby formed along the trench 800 between the drain and source regions 103a and 103b. Since the trench 800 can be formed in a very fine pattern, the cell size is made smaller than that shown in FIG. 1.

It is apparent that the present invention is not limited to the above embodiments, but may be modified and changed without departing from the scope and spirit of the invention. For example, the respective conductivity types are changed to other types, and the material for the respective insulating films or layers may replaced with other suitable ones.

What is claimed is:

1. A semiconductor memory device comprising a memory cell portion formed on a semiconductor substrate and having a plurality of memory cells formed in respective active regions, each of said memory cells being composed of a cell transistor and a storage capacitor, each of said active regions being isolated from peripheral ones of said active regions by trench isolation regions in a first direction and by isolation gate conductors in a second direction perpendicular to said first direction, said isolation gate conductors including conductive lines, respectively, which extend in said second direction in parallel to one another, and each of said conductive lines being formed in a straight line shape with a substantially uniform width.

2. The device as claimed in claim 1, wherein:

each of said trench isolation regions comprises a first trench selectively formed in said semiconductor substrate; and a first insulating film filling said first trench and each of said conductive lines is supplied with a bias voltage and is made of the same material and thickness as a word line serving as a gate of said cell transistor, each of said isolation gate conductors further including a second insulating film intervening between said semiconductor substrate and said conductive line and having the same thickness as a gate insulating film of said cell transistor.

3. The device as claimed in claim 2, wherein each of said active regions has flat surface portion in which source and drain regions of said cell transistor are formed, said word line and said isolation gate conductor being formed respectively on said gate insulating film and said second insulating film covering said flat surface portion.

4. A semiconductor memory device comprising a memory cell portion formed on a semiconductor substrate and having a plurality of memory cells formed in respective active regions, each of said memory cells being composed of a cell transistor and storage capacitor, each of said active regions being isolated from peripheral ones of said active regions by trench isolation regions in a first direction and by isolation gate conductors in a second direction perpendicular to said first direction, each of said trench isolation regions comprising a first trench selectively formed in said semiconductor substrate and a first insulating film filling said first trench, each of said isolation gate conductors being supplied with a bias voltage and comprising a conductive line made of the same material as a word line serving as a gate of said cell transistor, and a second insulating film intervening between said semiconductor substrate and said conductive line and having the same thickness as a gate insulting film of said cell transistor, and each of said isolation gate conductors further comprising a second trench selectively formed in said semiconductor substrate, said conductive line being buried in said second trench in isolation from said semiconductor substrate by said second insulating film.

5. The device as claimed in claim 4, wherein said word line is buried in a third trench selectively formed in said semiconductor substrate, said word line being isolated from said semiconductor substrate by said gate insulating film, said second and third trench having the same depth as each other.

6. A semiconductor memory device having a plurality of memory cells each composed of a cell transistor and a storage capacitor, said device comprising:

a semiconductor substrate;

a plurality of trench isolation regions selectively formed in said semiconductor substrate in a first direction in parallel to one another to thereby divide a surface portion of said semiconductor substrate into a plurality of element formation regions, each of said trench isolation regions including a first trench formed in said semiconductor substrate and a first insulating film filling said first trench;

a plurality of conductive lines formed to cross each of said trench isolation regions and each of said element formation regions in isolation therefrom by a second insulating film and in parallel to one another in a second direction perpendicular to said first direction, each of said conductive lines being applied with a bias potential to thereby electrically divide each of said element formation regions into a plurality of active regions and formed in a straight line shape;

a plurality of word lines each formed to run in said second direction between adjacent ones of said conductive lines and cross associated ones of said active regions in isolation therefrom by a gate insulating film to serve as a gate electrode of said cell transistor, each of said word lines being thereby free from crossing each of said conductive lines;

a plurality of pairs of source and drain regions, each pair formed in an associated one of said active regions for said cell transistor;

a plurality of storage capacitors each formed to be connected to an associated one of said source regions; and a plurality of bit lines each formed to be connected to associated ones of said drain regions.

7. A semiconductor memory device having a plurality of memory cells each composed of a cell transistor and a storage capacitor, said device comprising:

a semiconductor substrate;

a plurality of trench isolation regions selectively formed in said semiconductor substrate in a first direction in parallel to one another to thereby divide a surface portion of said semiconductor substrate into a plurality of element formation regions, each of said trench isolation regions including a first trench formed in said semiconductor substrate and a first insulating film filling said first trench;

a plurality of conductive lines formed to cross each of said trench isolation regions and each of said element formation regions in isolation therefrom by a second insulting film and in parallel to one another in a second direction perpendicular to said first direction, each of said conductive lines being applied with a bias potential to thereby electrically divide each of said element formation regions into a plurality of active regions;

a plurality of word lines each formed to cross associated ones of said active regions in isolation therefrom by a gate insulating film to serve as a gate electrode of said cell transistor;

a plurality of pairs of source and drain regions each pair formed in an associated one of said active regions for said cell transistor;

a plurality of storage capacitors each formed to be connected to an associated one of said source regions;

a plurality of bit lines each formed to be connected to associated ones of said drain regions: and a plurality of second trenches in which said conductive lines are buried, respectively, with intervention of said second insulating film.

8. The device as claimed in claim 1, further comprising:

an insulating film formed on said semiconductor substrate; and a plurality of word lines lying in said second direction in parallel with said conductive lines, each of said plurality of word lines and said conductive lines being formed simultaneously on said insulating film, such that each of said plurality of word lines and said conductive lines lie in a same horizontal plane.

* * * * *